(12) United States Patent
Schultz (10) Patent No.: US 12,513,943 B2
(45) Date of Patent: Dec. 30, 2025

(54) APPARATUSES AND SYSTEMS FOR OFFSET CROSS FIELD-EFFECT TRANSISTORS

(71) Applicant: Advanced Micro Devices, Inc., Santa Clara, CA (US)

(72) Inventor: Richard Schultz, Fort Collins, CO (US)

(73) Assignee: Advanced Micro Devices, Inc., Santa Clara, CA (US)

(*) Notice: Subject to any disclaimer, the term of this patent is extended or adjusted under 35 U.S.C. 154(b) by 574 days.

(21) Appl. No.: 17/974,643

(22) Filed: Oct. 27, 2022

(65) Prior Publication Data
US 2024/0145565 A1 May 2, 2024

(51) Int. Cl.
*H10D 30/67* (2025.01)
*H10D 62/10* (2025.01)
*H10D 62/17* (2025.01)

(52) U.S. Cl.
CPC ....... *H10D 30/6735* (2025.01); *H10D 62/118* (2025.01); *H10D 62/213* (2025.01)

(58) Field of Classification Search
CPC ............ H10D 30/6735; H10D 62/118; H10D 62/213; H10D 30/6757; H10D 30/43; H10D 62/121; H10D 84/85; H10D 84/0167; H10D 84/038; H10D 84/83; H10D 88/00; H10D 88/01
See application file for complete search history.

(56) References Cited

U.S. PATENT DOCUMENTS

| | | | |
|---|---|---|---|
| 2009/0200613 A1* | 8/2009 | Uemura | H10D 84/038 257/368 |
| 2019/0319137 A1* | 10/2019 | Lee | H10D 62/119 |
| 2020/0105752 A1* | 4/2020 | Liaw | H10D 30/6757 |
| 2021/0313333 A1* | 10/2021 | Liaw | H10D 30/43 |
| 2022/0045001 A1* | 2/2022 | Chao | H10D 89/601 |
| 2022/0173100 A1* | 6/2022 | Kim | H10D 89/10 |
| 2022/0270935 A1* | 8/2022 | Yang | H10D 86/215 |
| 2022/0285484 A1* | 9/2022 | Kim | H10D 64/017 |
| 2022/0336610 A1* | 10/2022 | Wu | H10D 62/151 |

FOREIGN PATENT DOCUMENTS

JP 2007287728 A * 11/2007 ......... H01L 27/1203

OTHER PUBLICATIONS

International Search Report and Written Opinion dated Feb. 19, 2024, for International Application No. PCT/US2023/077821; 9 pages.

* cited by examiner

*Primary Examiner* — S M Sohel Imtiaz
(74) *Attorney, Agent, or Firm* — Greenberg Traurig, LLP (57) ABSTRACT

The disclosed integrated circuit for offset cross field effect transistors can include a first transistor include a first channel oriented in a first direction; an oxide layer adjacent to the first transistor; and a second transistor adjacent to the oxide layer. The second transistor can include a second channel that is oriented in a direction orthogonal to the first direction, and the first channel and the second channel can be laterally offset such that the second channel does not cross over the first channel. Various other apparatuses, systems, and methods are also disclosed.

20 Claims, 15 Drawing Sheets

APPARATUSES AND SYSTEMS FOR OFFSET CROSS FIELD-EFFECT TRANSISTORS

BACKGROUND

Non-planar transistors can allow for scaling semiconductor devices beyond that of planar transistor designs.

BRIEF DESCRIPTION OF THE DRAWINGS

The accompanying drawings illustrate a number of example implementations and variations and are a part of the specification. Together with the following description, these drawings demonstrate and explain various principles of the present disclosure.

Throughout the drawings, identical reference characters and descriptions indicate similar, but not necessarily identical, elements. While the example implementations and variations described herein are susceptible to various modifications and alternative forms, specific implementations and variations have been shown by way of example in the drawings and will be described in detail herein. However, the example implementations and variations described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

The present disclosure is generally directed to apparatuses, systems, and methods for offset cross field effect transistors.

In some implementations, cross field effect transistors (or "XFETs") are vertically stacked gate-all-around (GAA) transistors where a top vertical GAA transistor is formed vertically on top of a bottom GAA transistor with at least an isolating oxide layer in between the two GAA transistors. In addition, the top GAA transistor has one or more conducting channels positioned orthogonal to the one or more conducting channels of the bottom GAA transistor. Therefore, the direction of current flow of the top GAA transistor through one or more top channels is orthogonal to the direction of current flow of the one or more bottom channels of the bottom GAA transistor.

In some implementations, offset cross field effect transistors (or "TFETs") are XFETs where the one or more top channels of the top GAA transistor are laterally offset such that they do not cross over the one or more bottom channels of the bottom GAA transistor. Thus, the one or more top channels and the one or more bottom channels of a TFET can form a 'T' shape. In some variations, the channels of a TFET can be formed of nanosheets. Thus, the top channel nanosheet(s) and the bottom channel nanosheets can be offset from each other.

In some implementations, the top channel nanosheet(s) can be moved away from a bottom channel local interconnect such that a metal side wall contact can be full width as it passes the top channel nanosheet. The top channel local interconnect can clear the top channel nanosheet before contacting the lower bottom channel local interconnect. In some variations, instead of a top channel local interconnect to lower channel local interconnect contact, there can be top channel to bottom channel gate contacts with both are over field.

In some implementations, one or more of the TFET designs described herein can allow for both a top channel to bottom channel gate-to-gate structure as well as a top channel and bottom channel local interconnect structure that can lower the resistance and/or capacitance of a device. In addition, in implementations in which a top channel local interconnect clears a bottom channel nanosheet before contacting the lower bottom channel interconnect, there can be a lower-resistance contact between the top channel and bottom channel local interconnect connections. Furthermore, in these implementations there can be a more reliable yield, greater device reliability, and/or less process resistance variation. In addition, one or more of the TFET designs described herein can involve less complicated select etch bias process modules, using fewer materials and allowing for a lower cost. Also, in some implementations offsetting the top and bottom GAA transistors can mitigate thermal heat spreading.

The top GAA transistor has a doping polarity of one or more top channels that is an opposite polarity of the doping polarity of one or more bottom channels of the bottom GAA transistor. For example, in an implementation, the top GAA transistor includes one or more p-type channels, whereas, the bottom GAA transistor includes one or more n-type channels. In another implementation, the p-type and n-type polarities are reversed between the one or more channels of the top GAA transistor and the bottom GAA transistor. With the orthogonal orientation between the top GAA transistor and the bottom GAA transistor, both the top and bottom GAA transistors have the maximum mobility for their respective carriers based on their orientation.

Figure 1:
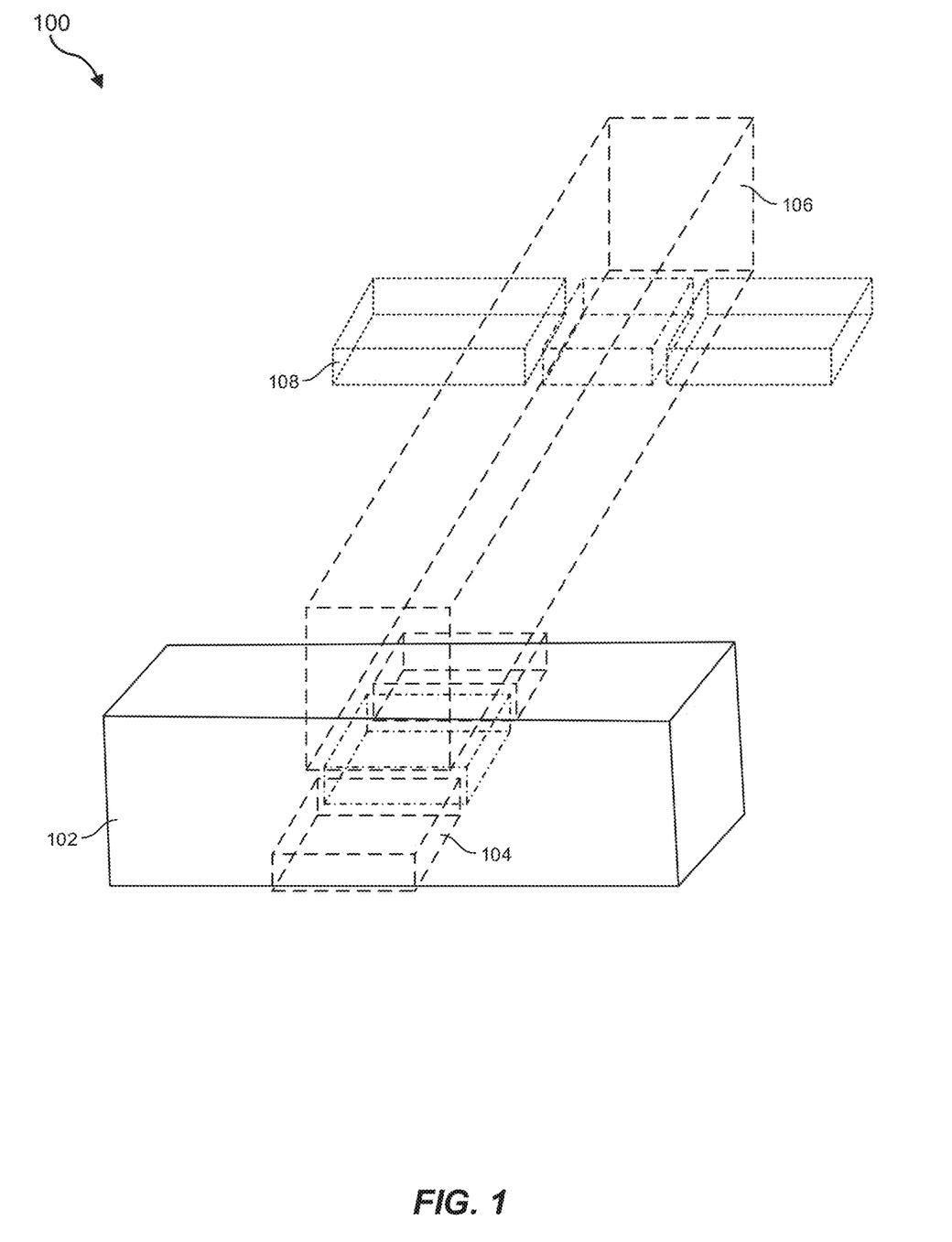
FIG. 1 is an illustration of an example pair of offset cross field effect transistors.
Figure 2:
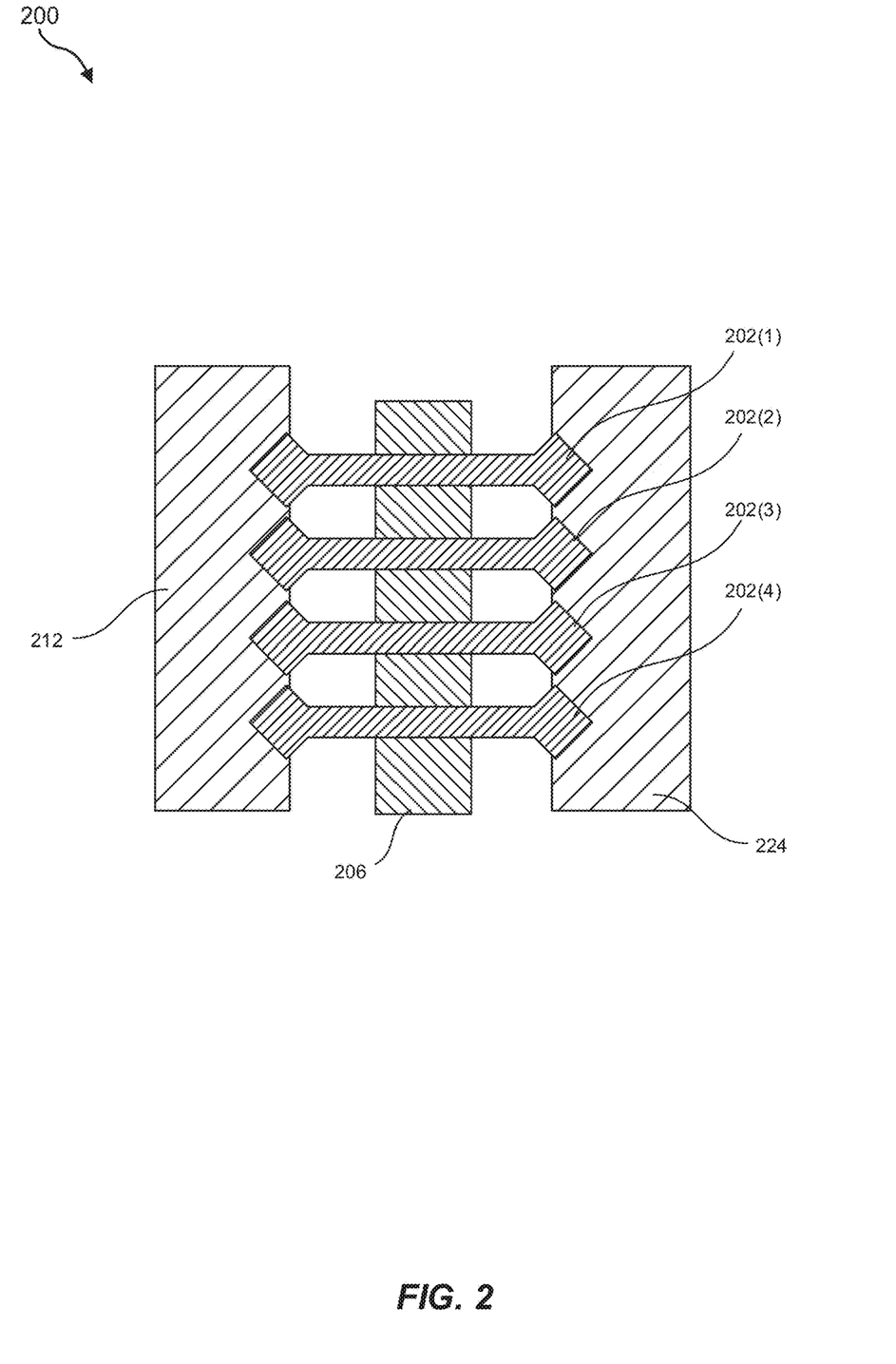
FIG. 2 is an illustration of an example transistor.
Figure 13:
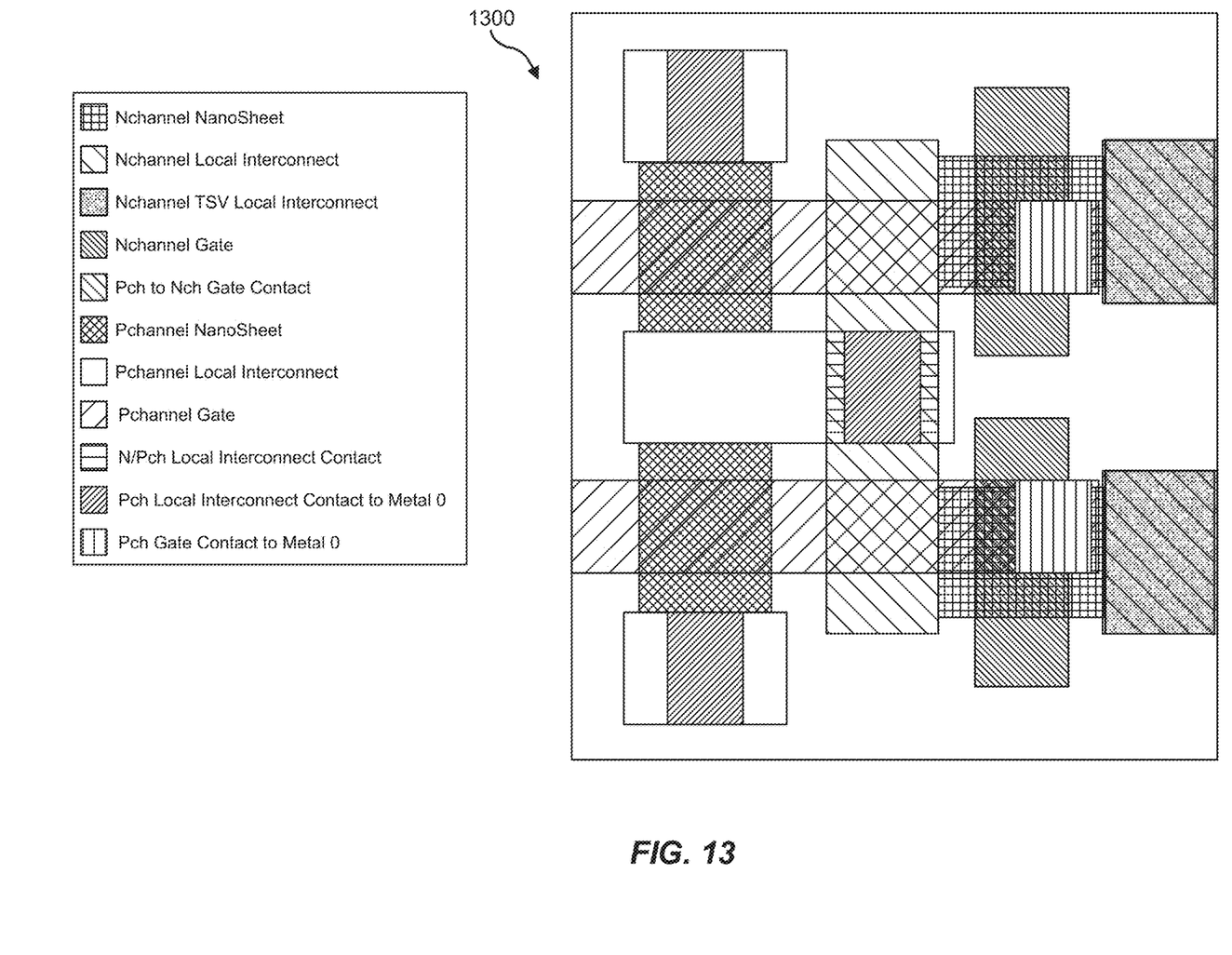
FIG. 13 is an illustration of a layered view of an example layout using offset cross field effect transistors.
Figure 14:
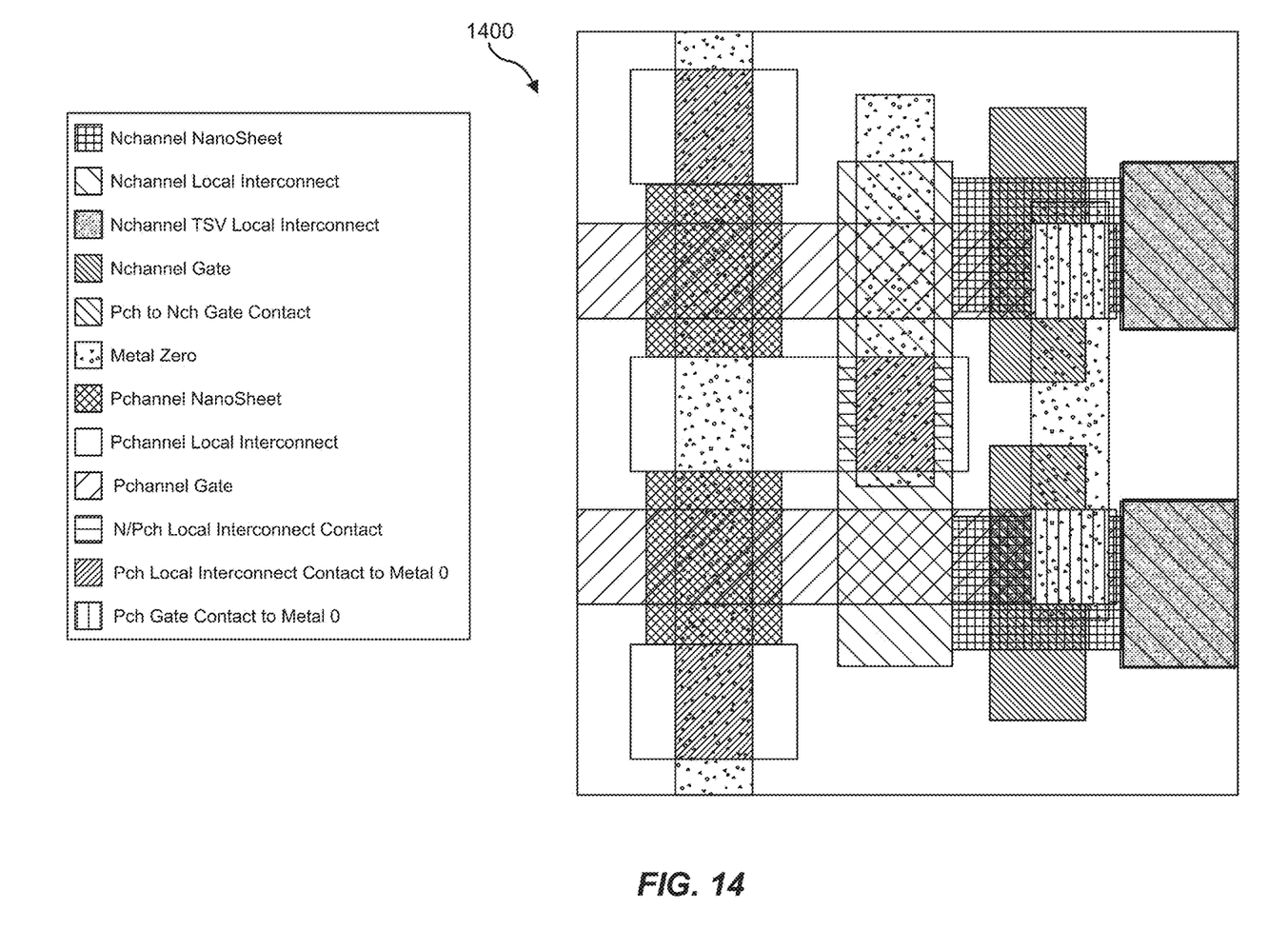
FIG. 14 is an illustration of a layered view of an example layout using offset cross field effect transistors.
Figure 15:
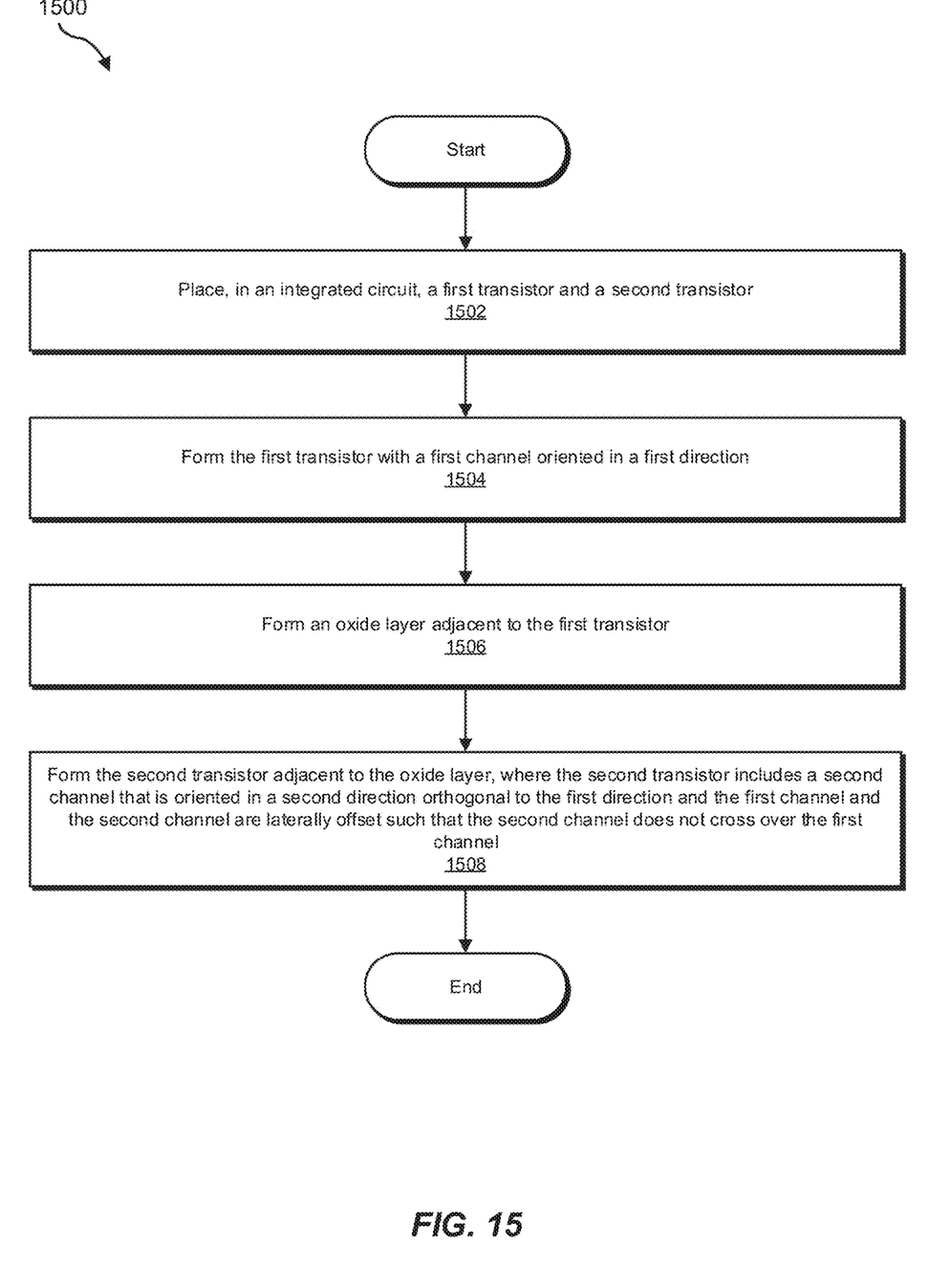
FIG. 15 is a flow diagram of an example method for manufacturing offset cross field effect transistors.

The following will provide, with reference to FIG. 1, detailed descriptions of an example TFET; with respect to FIG. 2, detailed descriptions of an example GAA transistor; with respect to FIGS. 3-6, detailed descriptions of example connections for and arrangements of GAA transistors; with respect to FIGS. 7-14 detailed descriptions of an example layout for a device using TFETs; and, with respect to FIG. 15, detailed descriptions of an example method of manufacture for TFETs.

FIG. 1 is a three-dimensional illustration of an example TFET pair 100. As shown in FIG. 1, a p-type device is vertically stacked on an n-type device. The n-type device includes at least an n-type gate 102 formed all around an n-type channel 104. Similarly, a p-type gate 106 is formed all around a p-type channel 108. Therefore, the p-type channel 108 has a doping polarity that is an opposite polarity of the n-type channel 104 of the bottom n-type device. Although a single n-type channel 104 and a single p-type channel 108 is shown, in other implementations, the semiconductor devices include another number of channels. In other implementations, the channels are nanosheets.

The n-type channel 104 and the n-type gate 102 are oriented in an orthogonal direction to the p-type channel 108 and the p-type gate 106. In other words, the n-type channel 104 and the n-type gate 102 are oriented in a direction that is 90 degrees from a direction of the p-type channel 108 and the p-type gate 106. Therefore, the direction of current flow of the bottom n-type device through the n-type channel 104 is orthogonal to the direction of current flow of the p-type channel 108 of the top p-type device.

As shown, in FIG. 1, p-type channel 108 does not cross over n-type channel 104. However, p-type gate 106 does cross over n-type gate 102, approximating a 'T' shape.

FIG. 2 is a cross-section illustration of an example transistor 200. As shown in FIG. 2, transistor 200 can be a GAA transistor. Transistor 200 can include multiple channels 202(1)-(4). In some variations, channels 202(1)-(4) can be nanosheets (e.g., of the same doping polarity). In some variations, transistor 200 can include fewer or more channels. Transistor 200 can also include a gate 206 that surrounds channels 202(1)-(4). Transistor 200 can also include a metal sidewall source 212 and a metal sidewall drain 224 that channels 202(1)-(4) contact on either side. Because source 212 and drain 224 provide metal areas, they can provide less resistance than if they were silicon. Thus, assuming a contact on the top side of transistor 200, while current from channel 202(4) travels further than current from channel 202(1), the difference in resistance between the current from channel 202(4) and the current from channel 202(1) is less than if the material were, e.g., silicon instead of metal. Thus, with metal sidewalls for source 212 and drain 224, transistor 200 can provide higher performance.

Figure 3:
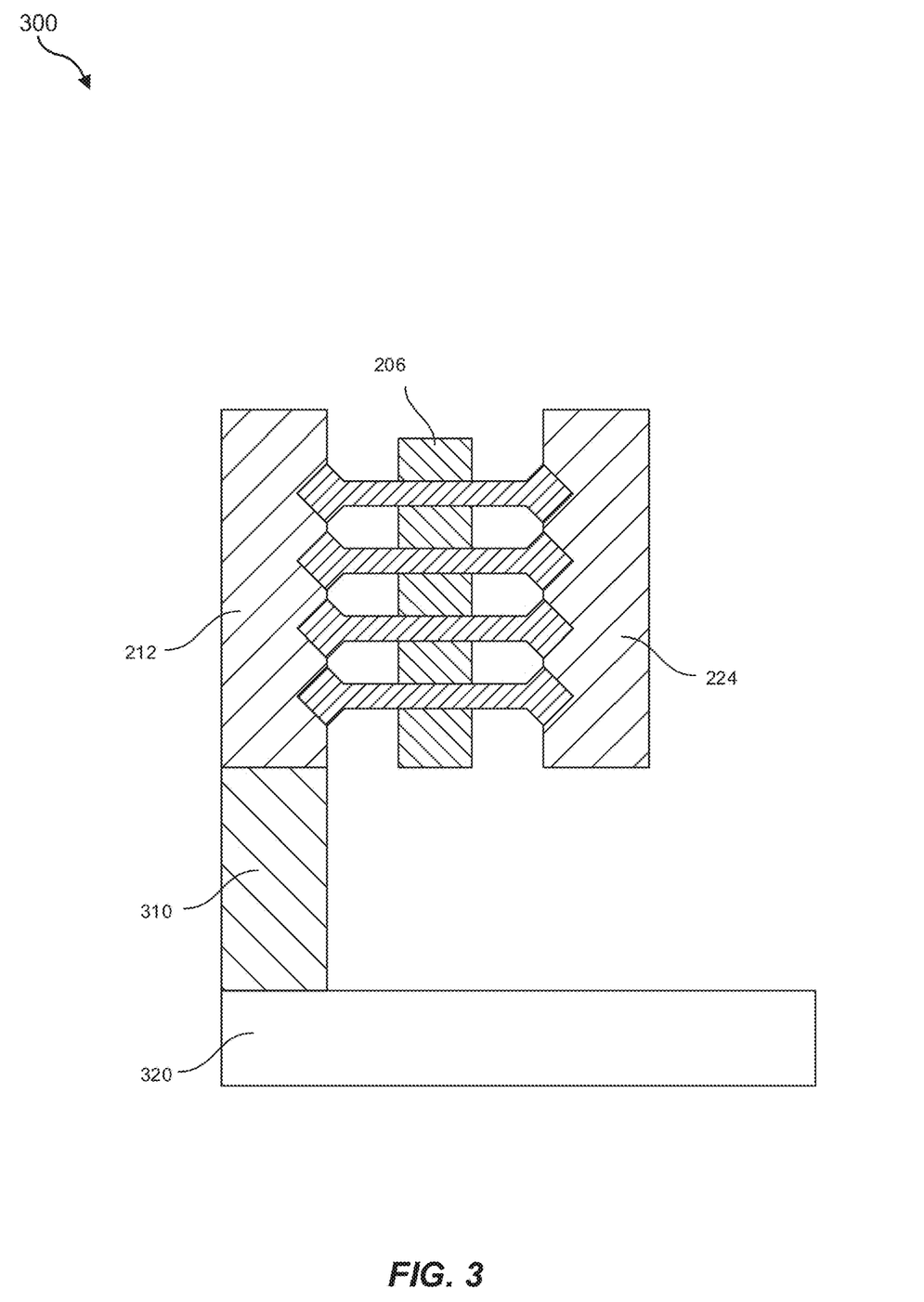
FIG. 3 is an illustration of an example transistor connected to power.

FIG. 3 is an illustration of an apparatus 300, including example transistor 200 from FIG. 2 connected to power. As shown in FIG. 3, transistor 200 is connected by a via 310 to a backside metal 0 ("M0") layer 320. Because source 212 is a metal sidewall contact, the metal can be continued down, by way of via 310, directly to backside M0 layer 320. This can provide a short, low-resistance path to providing power to transistor 200. In comparison, another design could include a via from backside M0 layer 320 to a contact (not pictured) to a frontside M0 layer (not pictured), to another contact (not pictured) to the top side of source 212. This alternate design could involve a longer, higher-resistance path, greater manufacturing complexity, and/or take up more space than the design shown in FIG. 3.

Figure 4:
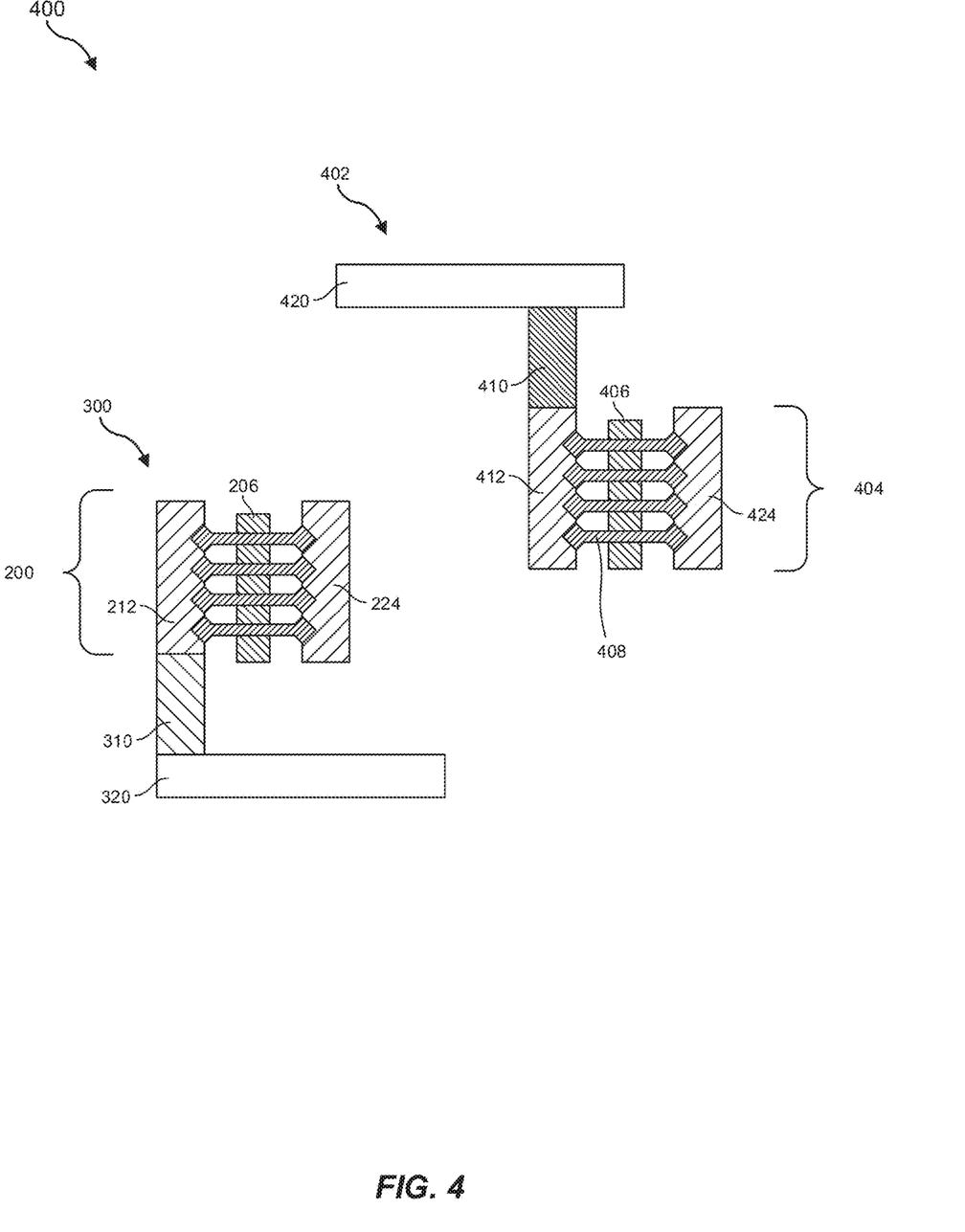
FIG. 4 is an illustration of an example pair of transistors, each connected to power.

FIG. 4 is an illustration of a design 400, including example apparatus 300 from FIG. 3 and an example apparatus 402. As shown in FIG. 4, apparatus 402 can include a transistor 404. Transistor 404 can be a GAA transistor, including a source 412, a drain 424, a gate 406, and one or more channels 408. Like transistor 200, source 412 and drain 424 can include metal sidewall contacts. In some implementations, source 412 can connect to a contact 410, which can connect to a frontside M0 layer 420. In some variations, transistor 200 and transistor 404 can have opposite polarities. For example, transistor 200 can be an n-channel device (e.g., connected to VSS) and transistor 404 can be a p-channel device (e.g., connected to VDD). Thus, backside M0 layer 320 can provide VSS only (for n-channel devices) and frontside M0 layer 420 can provide VDD only (for p-channel devices).

Figure 5:
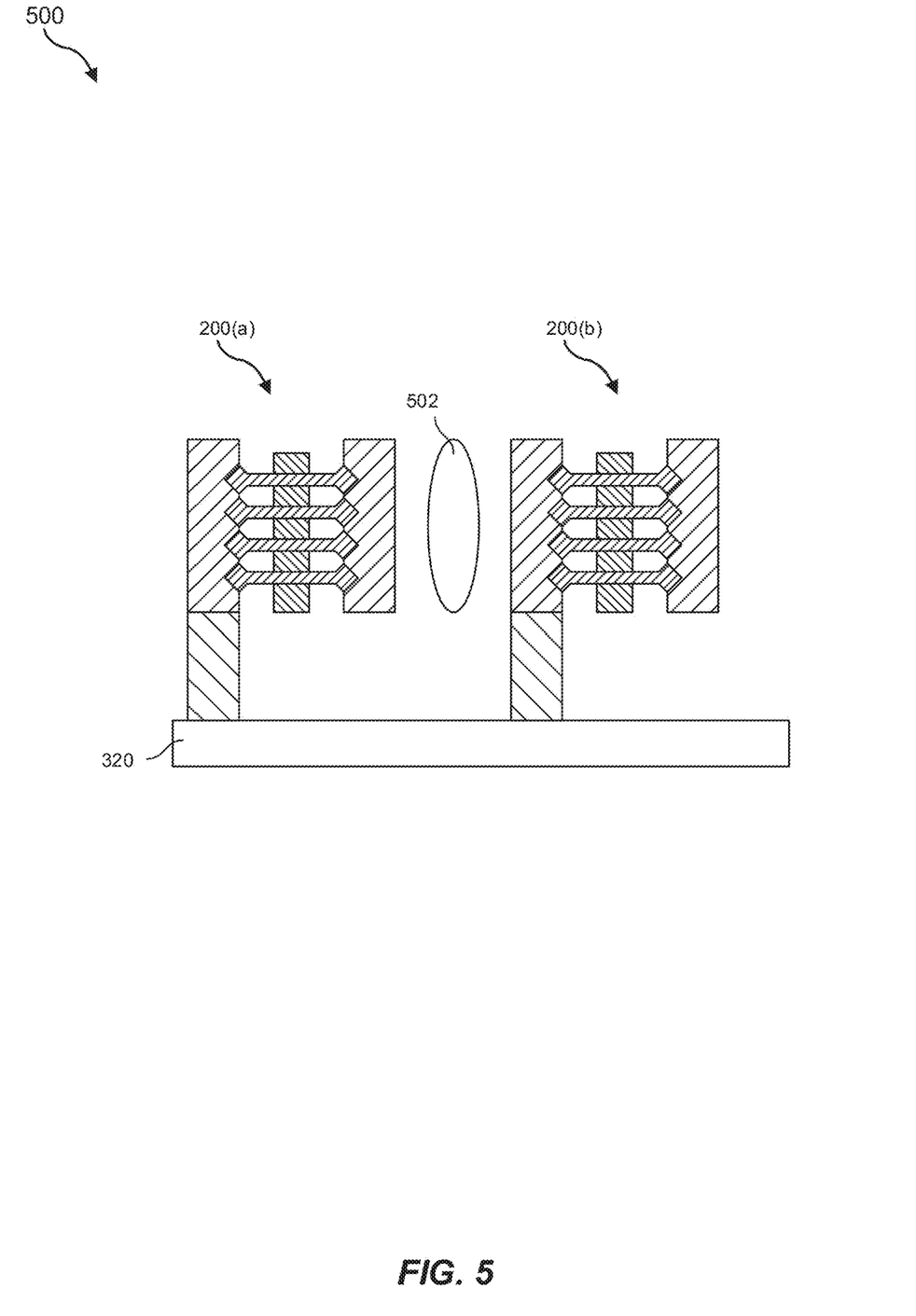
FIG. 5 is an illustration of an example pair of transistors separated by an air gap.
Figure 6:
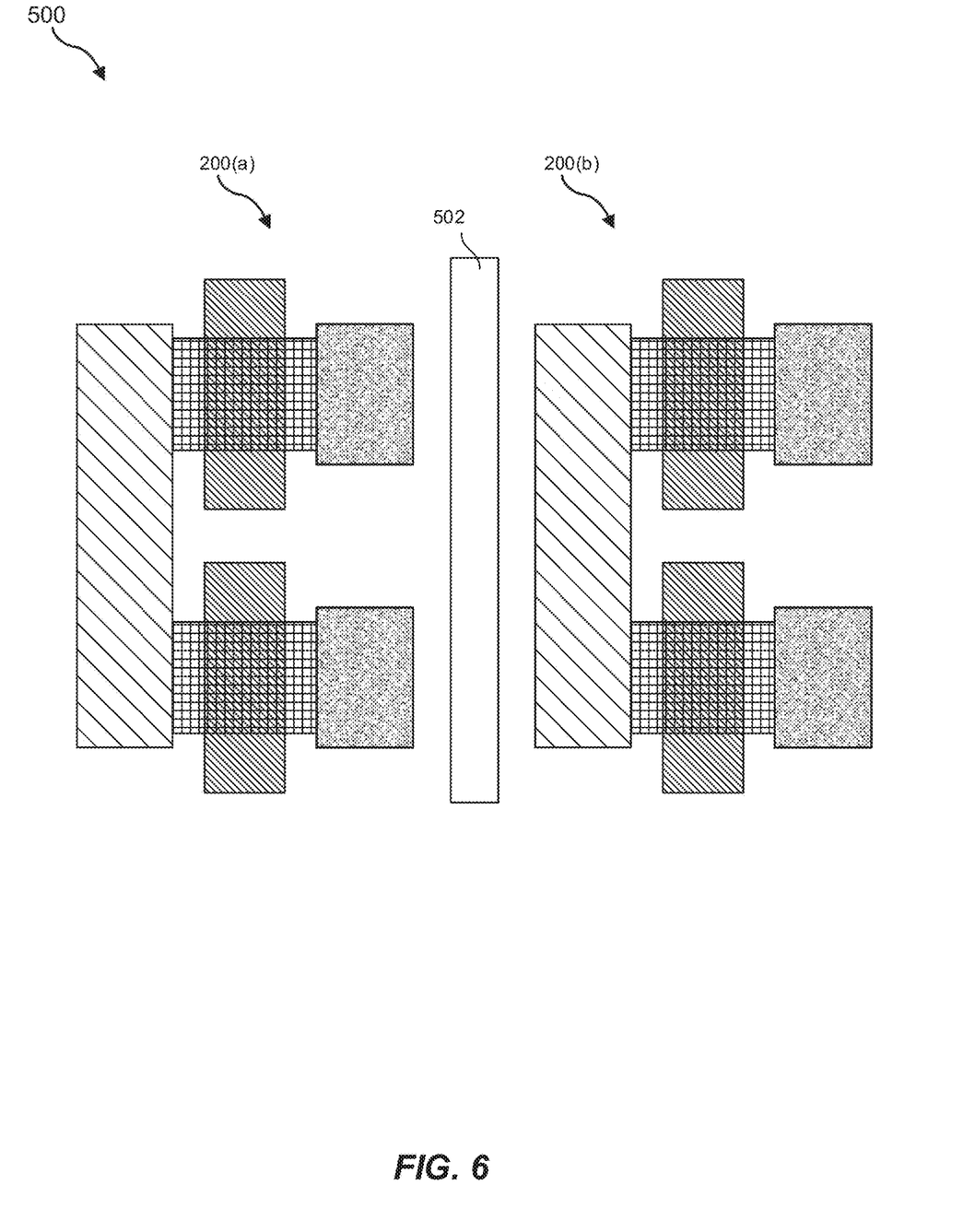
FIG. 6 is another view of the example pair of transistors of FIG. 5.

FIG. 5 is a cross-section view of a design 500 an example pair of transistors separated by an air gap. FIG. 6 is a top view of design 500 shown in FIG. 5. As shown in FIGS. 5-6, design 500 can include a transistor 200(a) and a transistor 200(b) (e.g., each instances of transistor 200 of FIG. 2) each with a power connection to backside M0 layer 320. As can been seen, a drain of transistor 200(a) can be proximate to a source of transistor 200(b). In other examples, design 500 includes the sources of the two transistors or the drains of the two transistors in proximity. Because there is an oxide layer between transistors 200(a) and 200(b), no other barrier is relied on to prevent shorting. Instead, design 500 includes an airgap 502 between transistors 200(a) and 200(b), which can result in lower capacitance.

In one variation, transistors 200(a) and 200(b) are n-channel devices. However, design 500 can also apply to adjacent p-channel devices. For example, device 404 of FIG. 4 can be a p-channel device, and apparatus 402 can include another p-channel device adjacent to device 404. A design can include an airgap between device 404 and the additional p-channel device.

In some variations, in place of the air gap, a design can include a non-conductive material that introduces compressive stress or tensile stress (i.e., between the two devices). In some examples such a design can improve the current drive of the devices.

Figure 7:
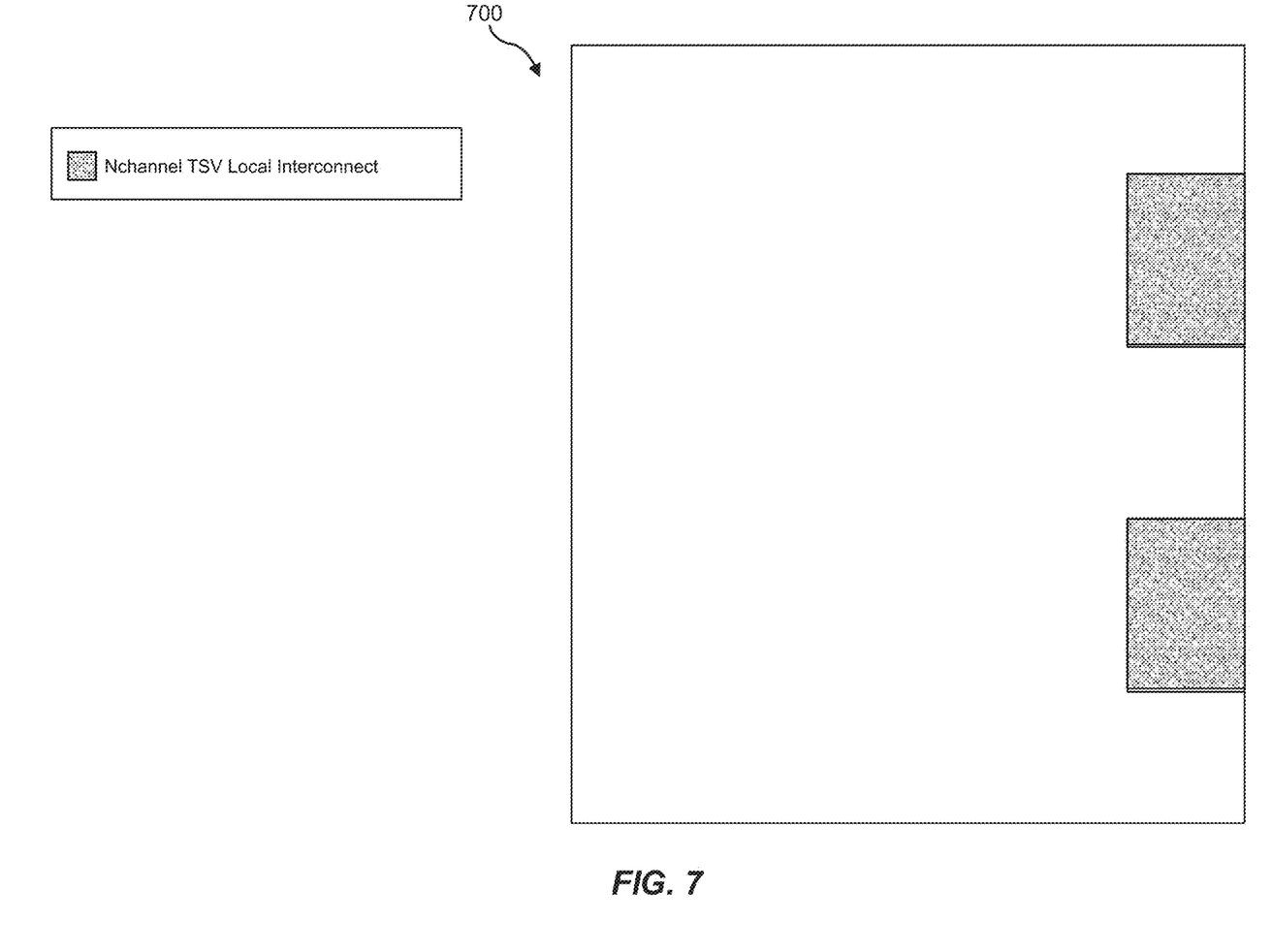
FIG. 7 is an illustration of a layered view of an example layout using offset cross field effect transistors.

FIG. 7 is an illustration of a layered view 700 of an example cell layout using TFETs. A backside M0 layer can be at the base of the layout. As shown in FIG. 7, an initial layer over the backside M0 layer can include through-silicon vias for n-channel local interconnect (e.g., for sources for n-channel devices).

Figure 8:
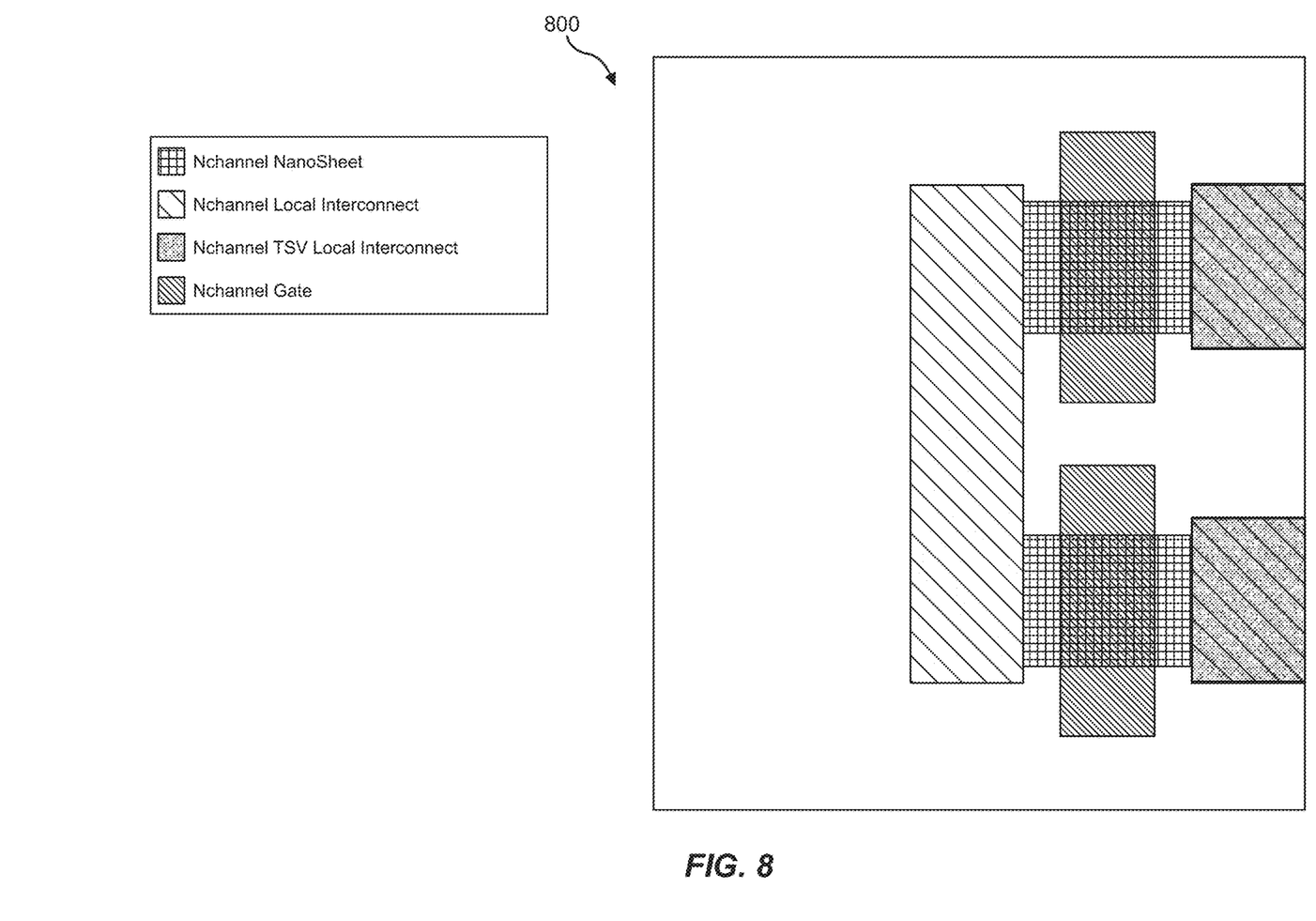
FIG. 8 is an illustration of a layered view of an example layout using offset cross field effect transistors.

FIG. 8 is a further illustration of a layered view 800 building on the example cell layout of FIG. 7. As shown in FIG. 8, the layout can further include n-channel local interconnects, including two sources and a connected drain, forming two n-channel GAA devices.

Figure 9:
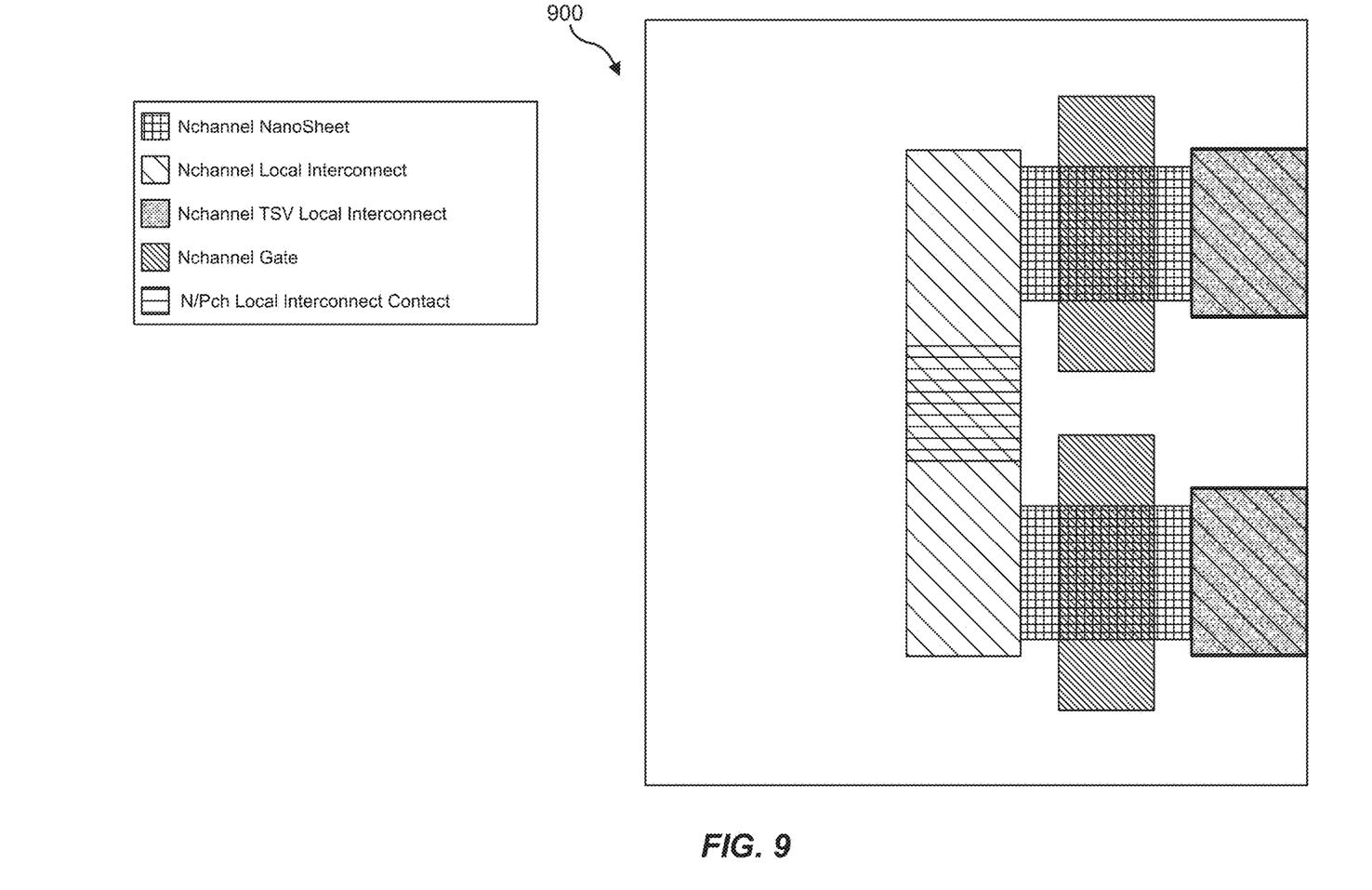
FIG. 9 is an illustration of a layered view of an example layout using offset cross field effect transistors.

FIG. 9 is a further illustration of a layered view 900 building on the example cell layout of FIG. 8. As shown in FIG. 9, a contact is placed on the output of the n-channel drain.

Figure 10:
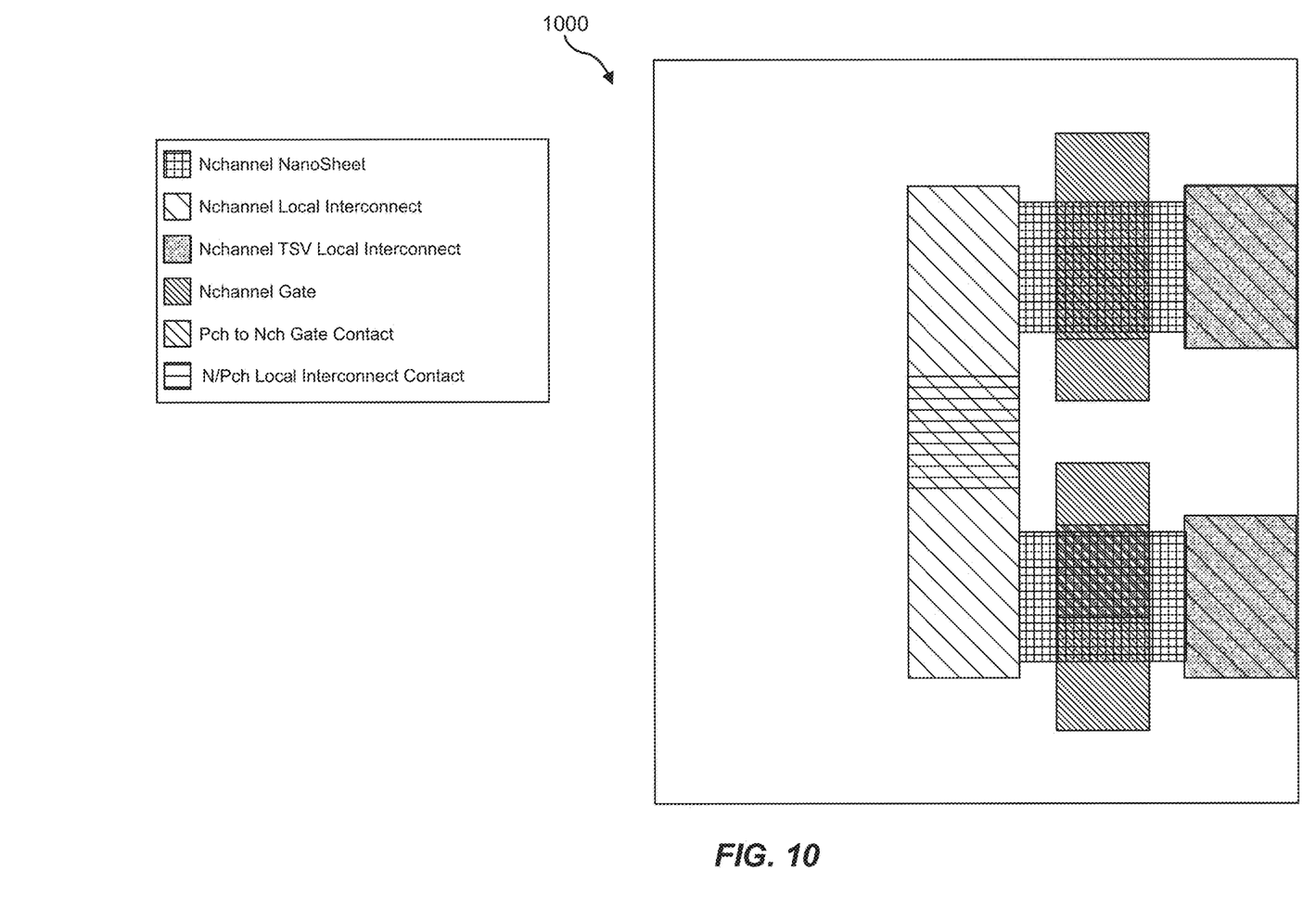
FIG. 10 is an illustration of a layered view of an example layout using offset cross field effect transistors.

FIG. 10 is a further illustration of a layered view 1000 building on the example cell layout of FIG. 9. As shown in FIG. 10, n-channel/p-channel gate contacts are placed on the two n-channel gates.

Figure 11:
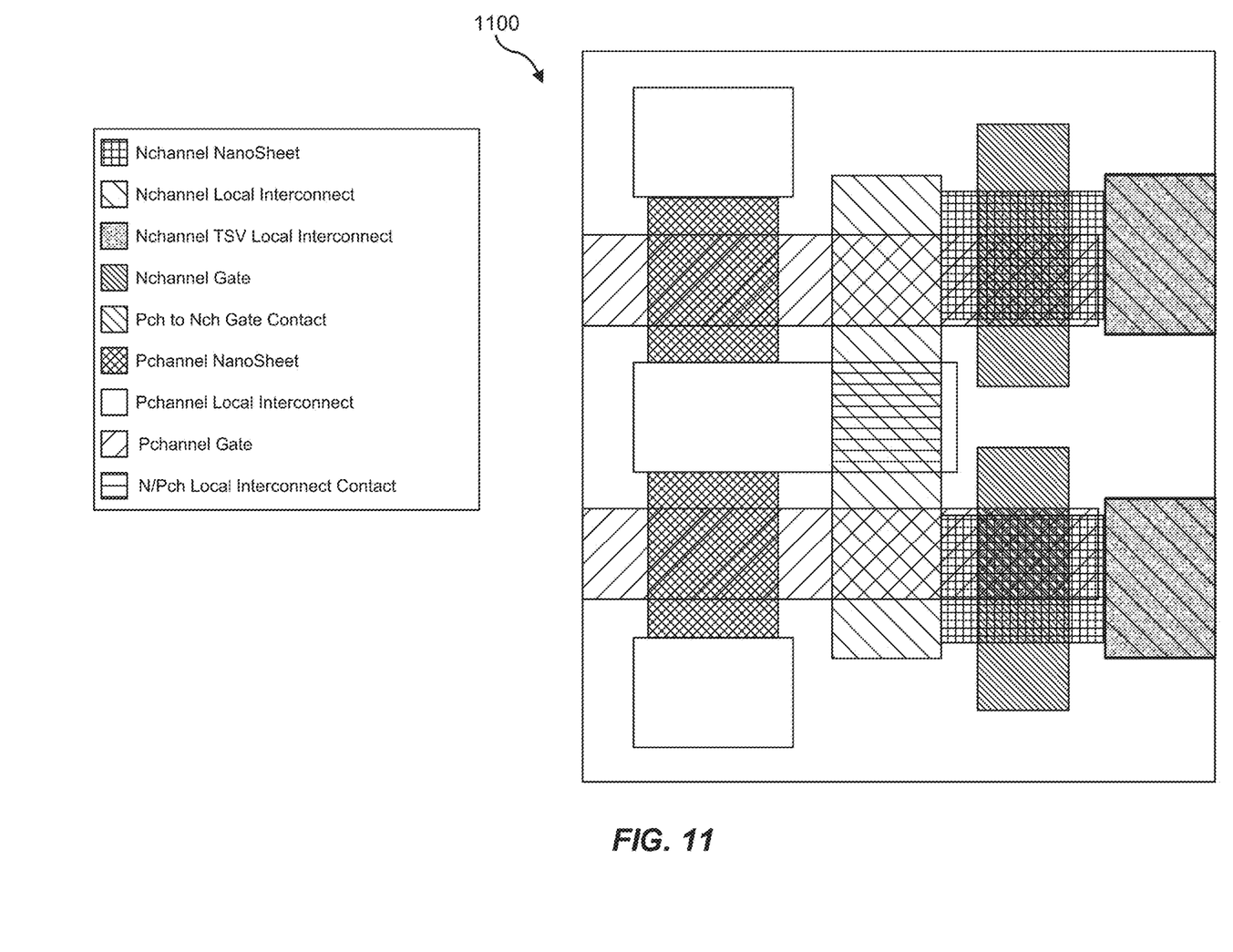
FIG. 11 is an illustration of a layered view of an example layout using offset cross field effect transistors.

FIG. 11 is a further illustration of a layered view 1100 building on the example cell layout of FIG. 10. As shown in FIG. 11, two p-channel devices are added, with two sources, and a shared drain. The shared drain of the p-channel devices connects with the shared drain of the n-channel devices (e.g., at the contact placed on the shared n-channel drain as shown in FIG. 9). In addition, the p-channel gates of the p-channel devices connect with the n-channel gates of the n-channel devices (e.g., at the n-channel/p-channel gate contacts placed as shown in FIG. 10).

Figure 12:
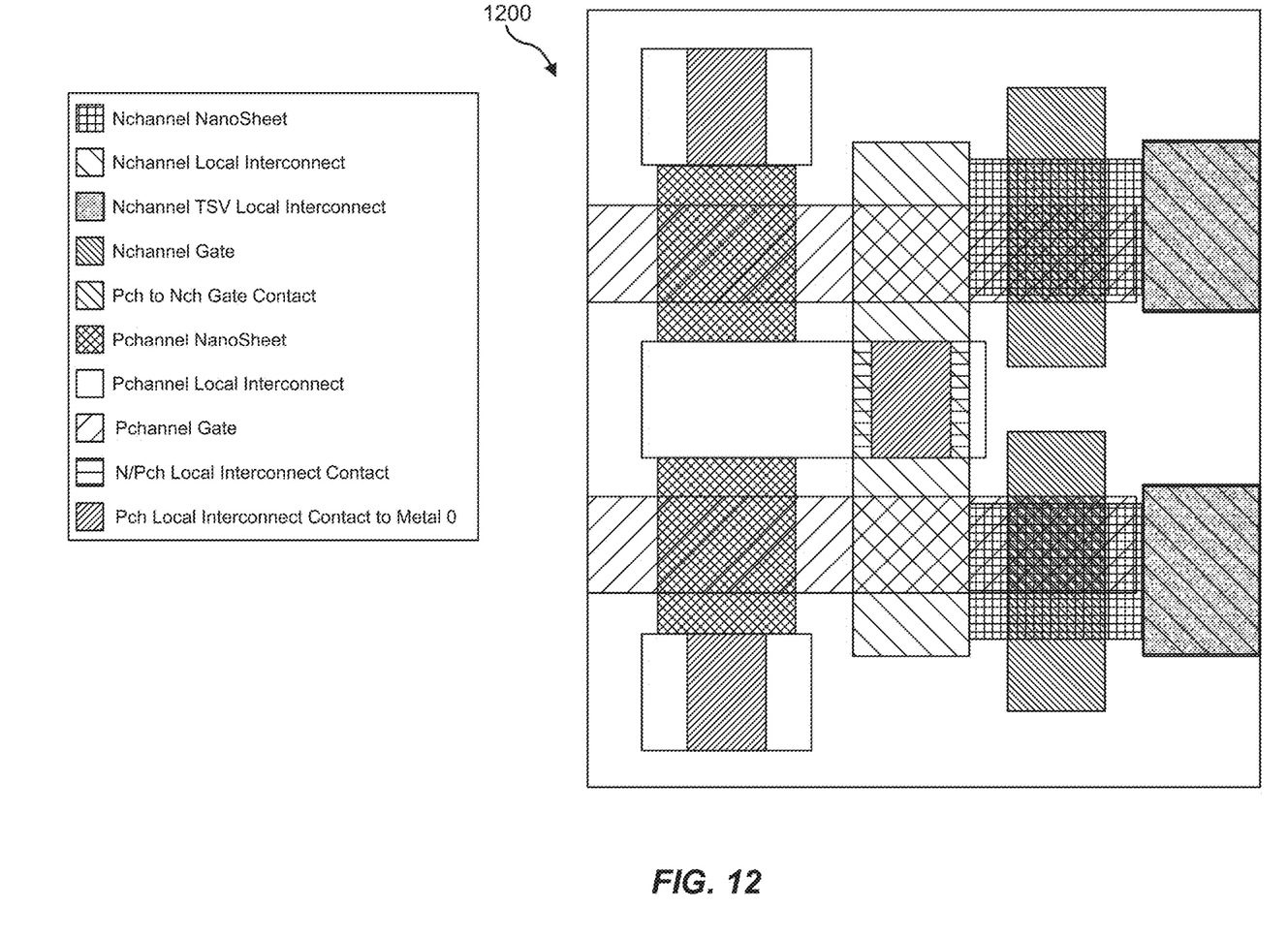
FIG. 12 is an illustration of a layered view of an example layout using offset cross field effect transistors.

FIG. 12 is a further illustration of a layered view 1200 building on the example cell layout of FIG. 11. As shown in FIG. 12, p-channel local interconnect contacts to frontside M0 are added, one each for the p-channel sources to provide power and one for an output contact to frontside M0 from the connected p-channel and n-channel drains.

FIG. 13 is a further illustration of a layered view 1300 building on the example cell layout of FIG. 12. As shown in FIG. 13, contacts are added onto the p-channel gates to frontside M0.

FIG. 14 is a further illustration of a layered view 1400 building on the example cell layout of FIG. 13. As shown in FIG. 14, a frontside M0 layer is added, tying together the two gates at the contacts shown in FIG. 13, providing output from the output contact shown in FIG. 12, and a VDD line running over the p-channel sources, connecting at the contacts on the sources shown in FIG. 12.

As can be appreciated, the cell layout demonstrated in FIGS. 7-14 results in an inverter that uses a TFET architecture.

FIG. 15 is a flow diagram of an example method for manufacturing offset cross field effect transistors. In some examples, each of the steps shown in FIG. 15 can represent a method whose structure includes and/or is represented by multiple sub-steps.

As illustrated in FIG. 15, at step 1502 a method can include placing, in an integrated circuit, a first transistor and a second transistor. In some implementations, the first and second transistors can be GAA transistors. In some implementations, the first and second transistors can have opposite doping polarities.

At step 1504 the method can include forming the first transistor with a first channel oriented in a first direction. At step 1506 the method can include forming an oxide layer adjacent to the first transistor.

At step 1508 the method can include forming the second transistor adjacent to the oxide layer, where the second transistor includes a second channel that is oriented in a second direction orthogonal to the first direction. The first channel and the second channel can be formed to be laterally offset from each other such that the second channel does not cross over the first channel. In some variations, a gate of the second channel can orthogonally cross over a gate of the first channel.

While the foregoing disclosure sets forth various implementations using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered example in nature since many other architectures can be implemented to achieve the same functionality.

In some examples, all or a portion of example system 100 in FIG. 1 can represent portions of a cloud-computing or network-based environment. Cloud-computing environments can provide various services and applications via the Internet. These cloud-based services (e.g., software as a service, platform as a service, infrastructure as a service, etc.) can be accessible through a web browser or other remote interface. Various functions described herein can be provided through a remote desktop environment or any other cloud-based computing environment.

In various implementations, all or a portion of example system 100 in FIG. 1 can facilitate multi-tenancy within a cloud-based computing environment. In other words, the modules described herein can configure a computing system (e.g., a server) to facilitate multi-tenancy for one or more of the functions described herein. For example, one or more of the modules described herein can program a server to enable two or more clients (e.g., customers) to share an application that is running on the server. A server programmed in this manner can share an application, operating system, processing system, and/or storage system among multiple customers (i.e., tenants). One or more of the modules described herein can also partition data and/or configuration information of a multi-tenant application for each customer such that one customer cannot access data and/or configuration information of another customer.

According to various implementations, all or a portion of example system 100 in FIG. 1 can be implemented within a virtual environment. For example, the modules and/or data described herein can reside and/or execute within a virtual machine. As used herein, the term "virtual machine" generally refers to any operating system environment that is abstracted from computing hardware by a virtual machine manager (e.g., a hypervisor).

In some examples, all or a portion of example system 100 in FIG. 1 can represent portions of a mobile computing environment. Mobile computing environments can be implemented by a wide range of mobile computing devices, including mobile phones, tablet computers, e-book readers, personal digital assistants, wearable computing devices (e.g., computing devices with a head-mounted display, smartwatches, etc.), variations or combinations of one or more of the same, or any other suitable mobile computing devices. In some examples, mobile computing environments can have one or more distinct features, including, for example, reliance on battery power, presenting only one foreground application at any given time, remote management features, touchscreen features, location and movement data (e.g., provided by Global Positioning Systems, gyroscopes, accelerometers, etc.), restricted platforms that restrict modifications to system-level configurations and/or that limit the ability of third-party software to inspect the behavior of other applications, controls to restrict the installation of applications (e.g., to only originate from approved application stores), etc. Various functions described herein can be provided for a mobile computing environment and/or can interact with a mobile computing environment.

The process parameters and sequence of steps described and/or illustrated herein are given by way of example only and can be varied as desired. For example, while the steps illustrated and/or described herein can be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

While various implementations have been described and/or illustrated herein in the context of fully functional computing systems, one or more of these example implementations can be distributed as a program product in a variety of forms, regardless of the particular type of computer-readable media used to actually carry out the distribution. The implementations disclosed herein can also be implemented using modules that perform certain tasks. These modules can include script, batch, or other executable files that can be stored on a computer-readable storage medium or in a computing system. In some implementations, these modules can configure a computing system to perform one or more of the example implementations disclosed herein.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An integrated circuit comprising:
a first transistor comprising a first channel oriented in a first direction and a first gate;
an oxide layer adjacent to the first transistor; and
a second transistor adjacent to the oxide layer, wherein:
the second transistor comprises:
a second channel that is oriented in a direction orthogonal to the first direction; and
a second gate extending in the first direction such that the second gate crosses over the first gate; and
the first channel and the second channel are laterally offset such that the second channel does not cross over the first channel.

2. The integrated circuit of claim 1, wherein:
the first channel comprises a first nanosheet;
the second channel comprises a second nanosheet;
the first transistor is a gate-all-around device; and
the second transistor is a gate-all-around device.

3. The integrated circuit of claim 2, wherein the first transistor further comprises a third channel comprising a third nanosheet.

4. The integrated circuit of claim 2, wherein the first gate extends in a second direction.

5. The integrated circuit of claim 4, further comprising a vertical gate contact coupled to the first gate and to the second gate.

6. The integrated circuit of claim 1, wherein a first doping polarity of the first channel is an opposite polarity of a second doping polarity of the second channel.

7. The integrated circuit of claim 1, wherein the second channel is formed on a wafer that is bonded with the oxide layer.

8. The integrated circuit of claim 1, wherein the first transistor comprises a first metal sidewall source and a first metal sidewall drain.

9. The integrated circuit of claim 1, wherein:
the second transistor comprises a second metal sidewall source and a second metal sidewall drain; and
the second metal sidewall source is directly connected to a front metal layer by a contact.

10. A system comprising:
physical memory comprising computer-executable instructions; and
an integrated circuit configured to execute the computer-executable instructions, the integrated circuit comprising:
a first transistor comprising a first channel oriented in a first direction and a first gate;
an oxide layer adjacent to the first transistor; and
a second transistor adjacent to the oxide layer, wherein:
the second transistor comprises:
a second channel that is oriented in a direction orthogonal to the first direction; and
a second gate extending in the first direction such that the second gate crosses over the first gate; and
the first channel and the second channel are laterally offset such that the second channel does not cross over the first channel.

11. The system of claim 10, wherein:
the first channel comprises a first nanosheet;
the second channel comprises a second nanosheet;
the first transistor is a gate-all-around device; and
the second transistor is a gate-all-around device.

12. The system of claim 11, wherein the first transistor further comprises a third channel comprising a third nanosheet.

13. The system of claim 11, wherein the first gate extends in a second direction.

14. The system of claim 13, further comprising a vertical gate contact coupled to the first gate and to the second gate.

15. The system of claim 10, wherein a first doping polarity of the first channel is an opposite polarity of a second doping polarity of the second channel.

16. The system of claim 10, wherein the second channel is formed on a wafer that is bonded with the oxide layer.

17. The system of claim 10, wherein the first transistor comprises a first metal sidewall source and a first metal sidewall drain.

18. The system of claim 17, further comprising a third transistor adjacent to the first transistor, wherein no diffusion break structure is interposed between the first transistor and the third transistor.

19. The system of claim 18, further comprising at least one of:
an air gap between the first transistor and the third transistor; or
a stress layer between the first transistor and the third transistor.

20. A method comprising:
placing, in an integrated circuit, a first transistor and a second transistor;
forming the first transistor with a first channel oriented in a first direction and a first gate;
forming an oxide layer adjacent to the first transistor; and
forming the second transistor adjacent to the oxide layer, wherein:
the second transistor comprises:
a second channel that is oriented in a second direction orthogonal to the first direction; and
a second gate extending in the first direction such that the second gate crosses over the first gate; and
the first channel and the second channel are laterally offset such that the second channel does not cross over the first channel.

* * * * *